United States Patent
Jenkins et al.

(10) Patent No.: US 7,218,091 B1
(45) Date of Patent: May 15, 2007

(54) INTEGRATED CMOS SPECTRUM ANALYZER FOR ON-CHIP DIAGNOSTICS USING DIGITAL AUTOCORRELATION OF COARSELY QUANTIZED SIGNALS

(75) Inventors: Keith A. Jenkins, Sleepy Hollow, NY (US); Stanislav Polonsky, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/485,390

(22) Filed: Jul. 13, 2006

(51) Int. Cl.
*G01R 23/00* (2006.01)
(52) U.S. Cl. .................. 324/76.19; 324/76.22
(58) Field of Classification Search ............ 324/76.19, 324/76.22
See application file for complete search history.

(56) References Cited

U.S. PATENT DOCUMENTS 5,565,764 A * 10/1996 Priebe et al. ............ 324/76.21
5,949,798 A * 9/1999 Sakaguchi .................. 714/738
6,292,760 B1 * 9/2001 Burns ......................... 702/189
7,116,092 B2 * 10/2006 Jenkins et al. ........... 324/76.19

* cited by examiner

*Primary Examiner*—Walter Benson
(74) *Attorney, Agent, or Firm*—Anne V. Dougherty, Esq.; McGinn IP Law Group, PLLC

(57) ABSTRACT

An integrated spectrum analyzer for performing on-chip power spectrum measurements, includes a digital autocorrelator that includes an analog input for inputting analog signal samples from a chip, an analog-to-digital converter for converting the analog signal samples into digital signal samples, a storage register for storing a first converted digital signal sample for a period of time, a digital multiplier for multiplying the first stored digital signal after the period of time with a second undelayed digital signal sample to produce a product of multiplication, and an accumulator for accumulating a plurality of products of multiplication for each new period of time. The digital autocorrelator computes an autocorrelation function based on the analog signal samples and is integrally formed on the chip for performing power spectrum measurements on the analog signal samples to compute the autocorrelation function.

4 Claims, 4 Drawing Sheets

INTEGRATED CMOS SPECTRUM ANALYZER FOR ON-CHIP DIAGNOSTICS USING DIGITAL AUTOCORRELATION OF COARSELY QUANTIZED SIGNALS

BACKGROUND OF THE INVENTION

1. Field of the Invention

The present invention generally relates to an on-chip CMOS spectrum analyzer for performing diagnostics on signals using digital autocorrelation of coarsely quantized signals.

2. Description of the Related Art

In analog and mixed-signal communication circuits, it is often desired to measure the frequency spectrum of a circuit element. This might be needed, for example, in studying a PLL (phase locked-loop) to see if the frequency is at its required value, to study its phase noise, and to see if there is any crosstalk from noise sources with nearby frequencies. This measurement is generally done by bringing the signal of interest off the chip via a dedicated I/O pin and measuring its frequency content on an external spectrum analyzer (SA). This I/O pin must be connected to the circuit of interest via a high bandwidth driver which does not distort the signal to be measured. In general, this imposes a limit on the number of internal signals which can be measured. In a situation where there is an array of such circuits, such as a parallel bus of data channels all operating at similar, but not identical, frequencies, the measurement by this method requires multiple connections and disconnections. Thus, the measurement is time-consuming and not suitable for rapid testing. Furthermore, the number of points which can be measured is limited by the number of I/O pins which can be dedicated to this purpose.

SUMMARY OF THE INVENTION

In view of the foregoing and other exemplary problems, drawbacks, and disadvantages of the conventional methods and structures, an exemplary aspect of the present invention provides an integrated spectrum analyzer for performing on-chip power spectrum measurements.

Although not as versatile as a general purpose lab instrument, an on-chip spectrum analyzer has the advantages that 1) multiple internal nodes can be measured directly, 2) no extra high-speed I/O circuits are required, 3) measurements can be made quickly for automated testing, if required, and 4) the spectrum is digitized on-chip so its digital representation can be acquired by a low speed digital tester. The chief purpose of the proposed on-chip spectrum analyzer is to (1) minimize the amount of on-chip analog signal processing, and (2) minimize the complexity of a spectrum analyzer, possibly at the expense of time, required to measure the spectrum.

A representative spectrum analyzer includes an optional low noise amplifier (LNA), a mixer, for which the local oscillator (LO) is swept in frequency, a low pass filter, and a logarithmic amplifier whose output is optionally viewed synchronously with the LO frequency, and an analog to digital converter. The local oscillator is provided by either an external signal source or an on-chip frequency generator. Only one such source is required for any number of analyzers on the same chip. The architecture is a low-IF (or near-zero-IF) spectrum analyzer.

An exemplary aspect of the present invention includes an integrated spectrum analyzer for performing on-chip power spectrum measurements, the integrated spectrum analyzer including a digital autocorrelator having an analog input for inputting analog signal samples from a chip, an analog-to-digital converter for converting the analog signal samples into digital signal samples, a delay register for delaying a first converted digital signal sample, a digital multiplier for multiplying the first delayed digital signal sample with a second undelayed converted digital signal sample to produce products of multiplication, an accumulator for accumulating a plurality of the products of multiplication over a period of time, and a digital integrator for integrating the accumulated products of multiplication. The digital autocorrelator computes an autocorrelation function based on the analog signal samples, and is integral on the chip for performing power spectrum measurements on the analog signal samples to compute the autocorrelation function.

Another exemplary aspect of the present invention includes an integrated spectrum analyzer for performing on-chip power spectrum measurements, the integrated spectrum analyzer including a digital autocorrelator that includes an analog input for inputting coarsely quantized analog signal samples from a chip, an analog-to-digital converter for converting the analog signal samples into a digital signal samples, a storage register for storing a first converted digital signal sample for a period of time, a digital multiplier for multiplying the first stored digital signal after the period of time with a second undelayed digital signal sample to produce a product of multiplication, and an accumulator for accumulating a plurality of the products of multiplication for each new period of time. The digital autocorrelator computes an autocorrelation function based on the analog signal samples and is integral on the chip for performing power spectrum measurements on the analog signal samples to compute the autocorrelation function.

With its unique and novel features, the present invention provides integrated spectrum analyzer for performing on-chip power spectrum measurements to significantly reduce the time required for measuring signals and increasing the number of signals able to be measured on a chip.

BRIEF DESCRIPTION OF THE DRAWINGS

The foregoing and other exemplary purposes, aspects and advantages will be better understood from the following detailed description of an exemplary embodiment of the invention with reference to the drawings, in which.

DETAILED DESCRIPTION OF EXEMPLARY EMBODIMENTS OF THE INVENTION

Figure 1:
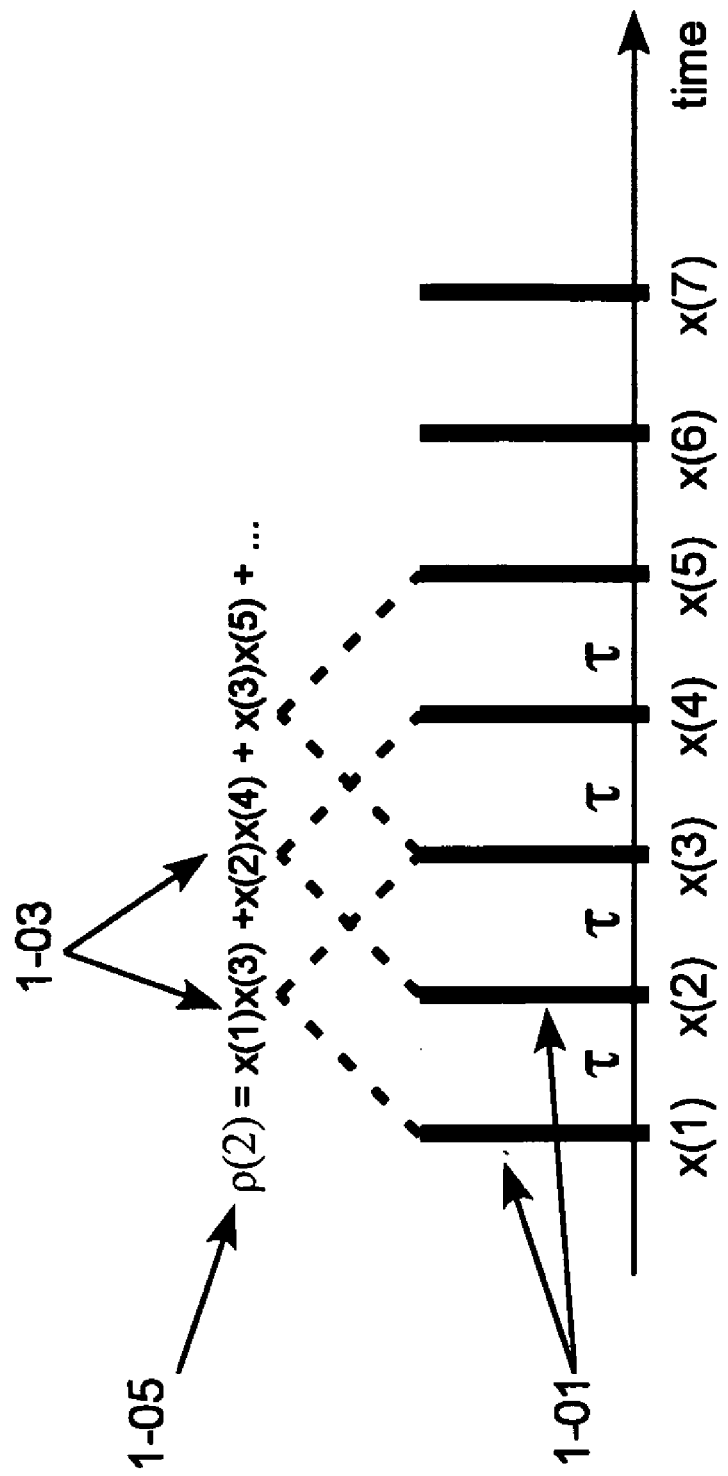
FIG. 1 illustrates a timing diagram a parallel autocorrelator.

Referring now to the drawings, and more particularly to FIGS. 1–4 here are shown exemplary embodiments of the method and structures of the present invention.

The present invention is a new method based on that of digital autocorrelation of coarsely quantized signals. This method was originally developed for spectral measurements of radio-astronomical signals as referenced in, Thompson, A. R., J. M. Moran, et al. (2001), Interferometry and Synthesis in Radio Astronomy, Wiley-Interscience.

The original method is based on the following two facts:

Fact 1. For a signal x(t) its power spectrum $$x^2(\omega) \equiv \int_{-\infty}^{+\infty} x^2(t) e^{-i\omega t} dt$$

can be computed from the autocorrelation function $$\rho(\tau) \equiv \int_{-\infty}^{+\infty} x(t) x(t-\tau) dt$$

by means of Fourier transform. In practice, for band limited signals, it is sufficient to compute the autocorrelation function at discrete points $\rho(k\tau) \equiv \rho(k)$:

$$\rho(k) = \frac{1}{N_s} \sum_{n=1}^{N_s} x(n) \cdot x(n+k), \quad k = 0, \ldots, N_k, \tag{1}$$

where the signal x(n) is sampled at Nyquist frequency $f_N = 1/\tau$, and $N_s$ is a sufficiently large number such that the resulting signal-to-noise ratio is adequate. The largest value of k, $N_k$, determines the frequency resolution $\Delta f = 1/N_k \tau$. The maximum frequency of the signal should be less than Nyquist frequency. FIG. 1 illustrates computation of equation (1) for k=2. Samples x(n) (1-01) are taken at constant time interval τ, products x(n)·x(n+2) are computed (1-03), and summed up to form the value of autocorrelation function ρ(2) (1-05).

Fact 2. Function ρ(k) can be reconstructed from the autocorrelation function r(k) which is computed using coarsely quantized signals $x_Q(k)$ (i.e. signals known with the accuracy of just few quantization levels). As an extreme example, ρ(k) can be computed even if we can only measure the sign of the signal:

$$\rho(k) = \rho(0) \sin\left(\frac{\pi}{2} r(k)\right), \tag{2}$$

where r(k) is the autocorrelation function of signal's sign (i.e. $x_Q = \text{sign}(x)$):

$$r(k) = \frac{1}{N_s} \sum_{n=1}^{N_s} \text{sign}(x(n)) \text{sign}(x(n+k)) \tag{3}$$

These facts allow one to design spectrum analyzers using digital autocorrelators with simple (few bits) integer arithmetic. The first fact reduces all required analog signal processing hardware to, basically, a few bit Analog-to-Digital Converter (ADC). The second fact simplifies the digital computation of autocorrelation function since one has to operate on short integer numbers.

Figure 2:
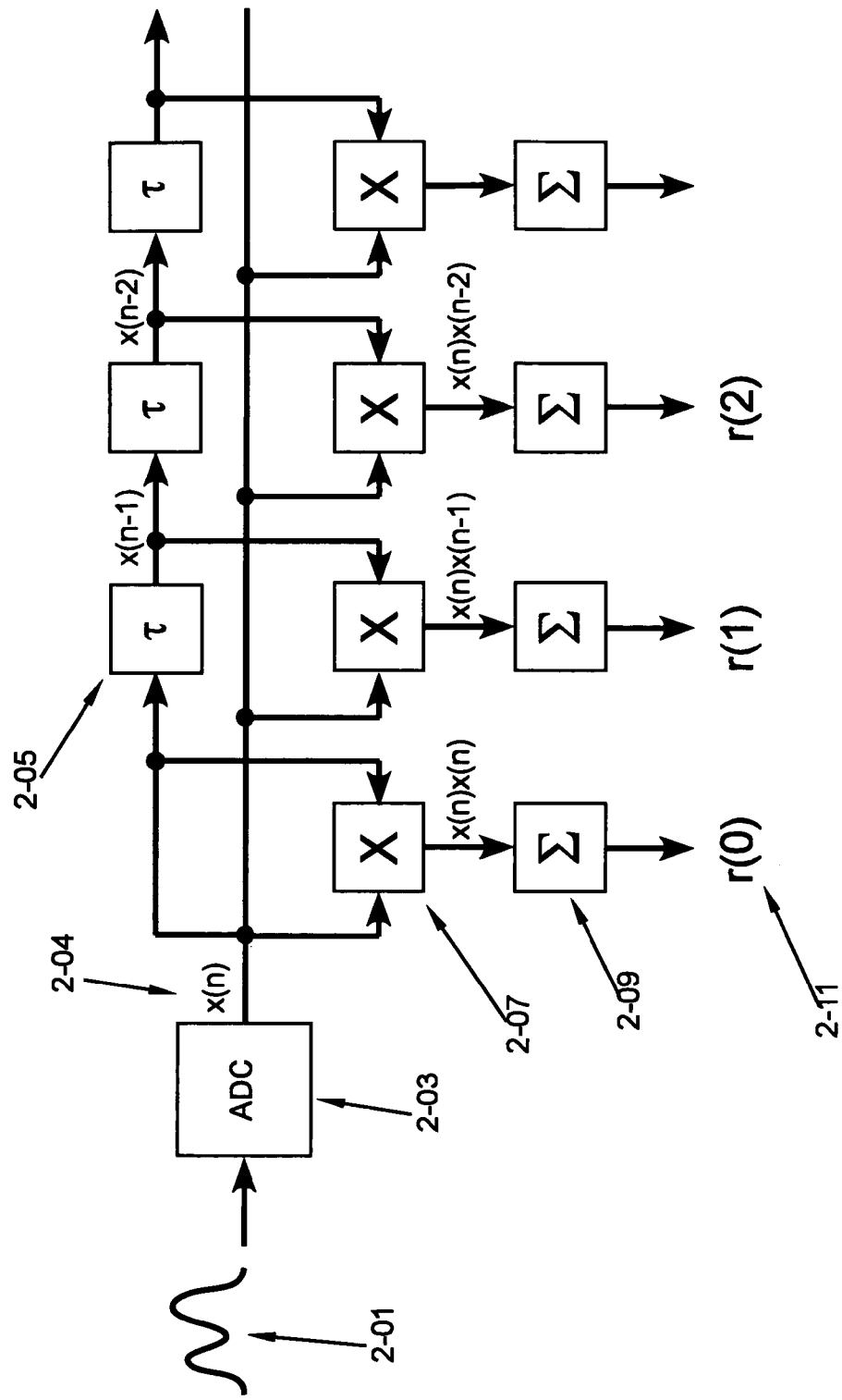
FIG. 2 illustrates a block-diagram of the parallel autocorrelator.

FIG. 2 shows a representative architecture of a digital autocorrelator. Analog input signal 2-01 is converted to N-level digital code x(n) 2-04 (quantized signal) in ADC 2-03 which is the only analog block of the design. The digitized signal x(n) 2-04 is delayed by τ in a number of discrete steps 2-05, and the delayed samples x(n-k) are digitally multiplied 2-07 with an undelayed version of the same signal. The products from the multiplications are then digitally integrated 2-09 and accumulated separately for each of the delay stages 2-11. Typically, the design of all digital blocks (delay element 2-05, multiplier 2-07, accumulator 2-09) is very simple since the datapath width is only few bits. In the above extreme example (wherein only the sign of the input signal is retained), the multiplier is nothing more than an XOR gate. After a specified number of samples $N_s$, the autocorrelation function r(k) is transformed by a computer to the frequency domain to form the power spectrum. It is important to mention that computation of all coefficients r(k) is performed in parallel, hence the necessity for multiple delay elements, multipliers, and integrators. In what follows, this architecture of autocorrelator is referred to as "parallel".

Figure 3:
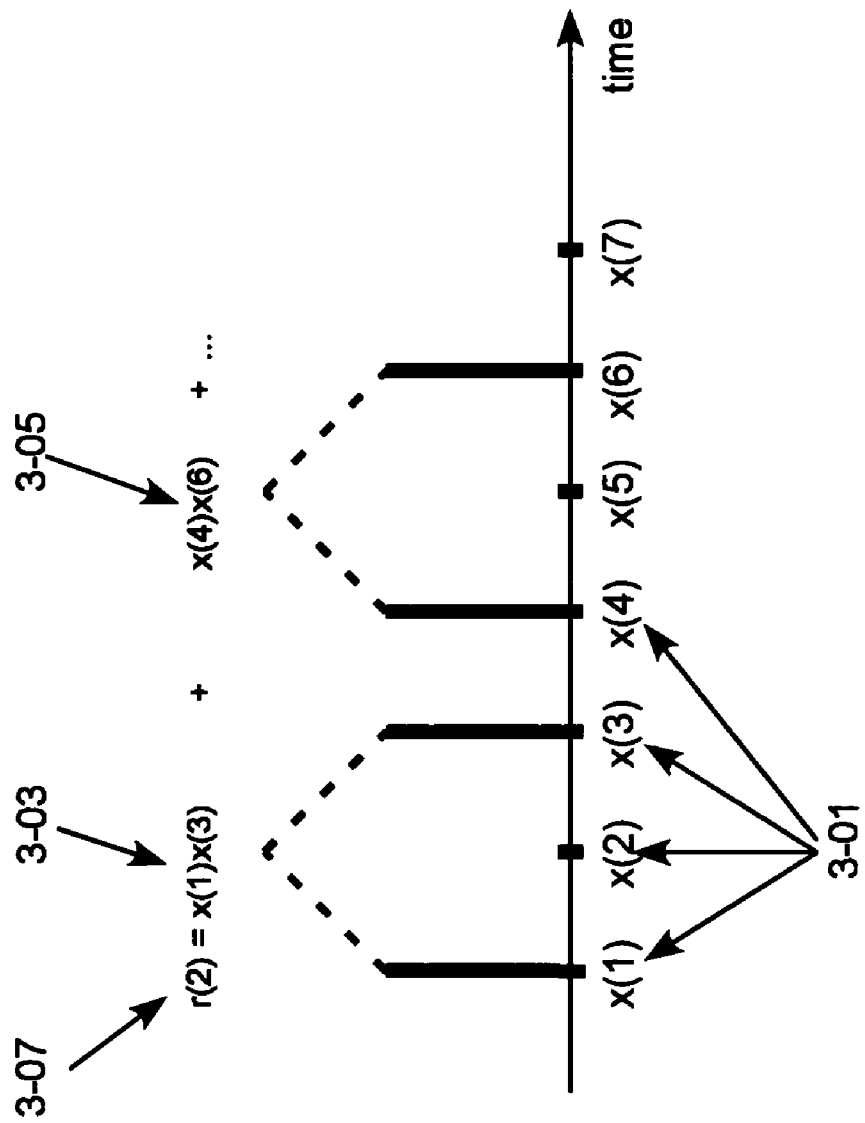
FIG. 3 illustrates a timing diagram for a sequential autocorrelator.

The present invention aims at reducing hardware requirements for a digital autocorrelator. The invention comprises a serial architecture that drastically reduces hardware at the expense of longer measurement time. The approach of the present invention is based on the following observation. The correlation function can be computed using only a subset of all available samples x(n). Similar to FIG. 1, FIG. 3 illustrates this statement for the case of computing r(2). Of all possible samples 3-01, $x_Q(1)$, $x_Q(3)$ are taken sequentially to form the product $x_Q(1) \cdot x_Q(3)$ (3-03), next samples $x_Q(4)$, $x_Q(6)$ form the product $x_Q(4) \cdot x_Q(6)$ (3-05), etc. The correlation function 3-07 is, respectively, the sum of these products. Mathematically, this observation is expressed as $$r(k) = \sum_{n=1}^{N_s} x_Q(j) x_Q(j+k), \quad j = (n-1)(k+1) + 1 \tag{4}$$

Also note that there are many ways to choose subsets of samples, or, equivalently, the dependence j(n). We only require that $$j(n) + k \leq j(n+1). \tag{5}$$

This requirement has simple graphical interpretation—the dashed lines on FIG. 3 should not intersect each other (compare with intersected dashed lines on FIG. 1)

Figure 4:
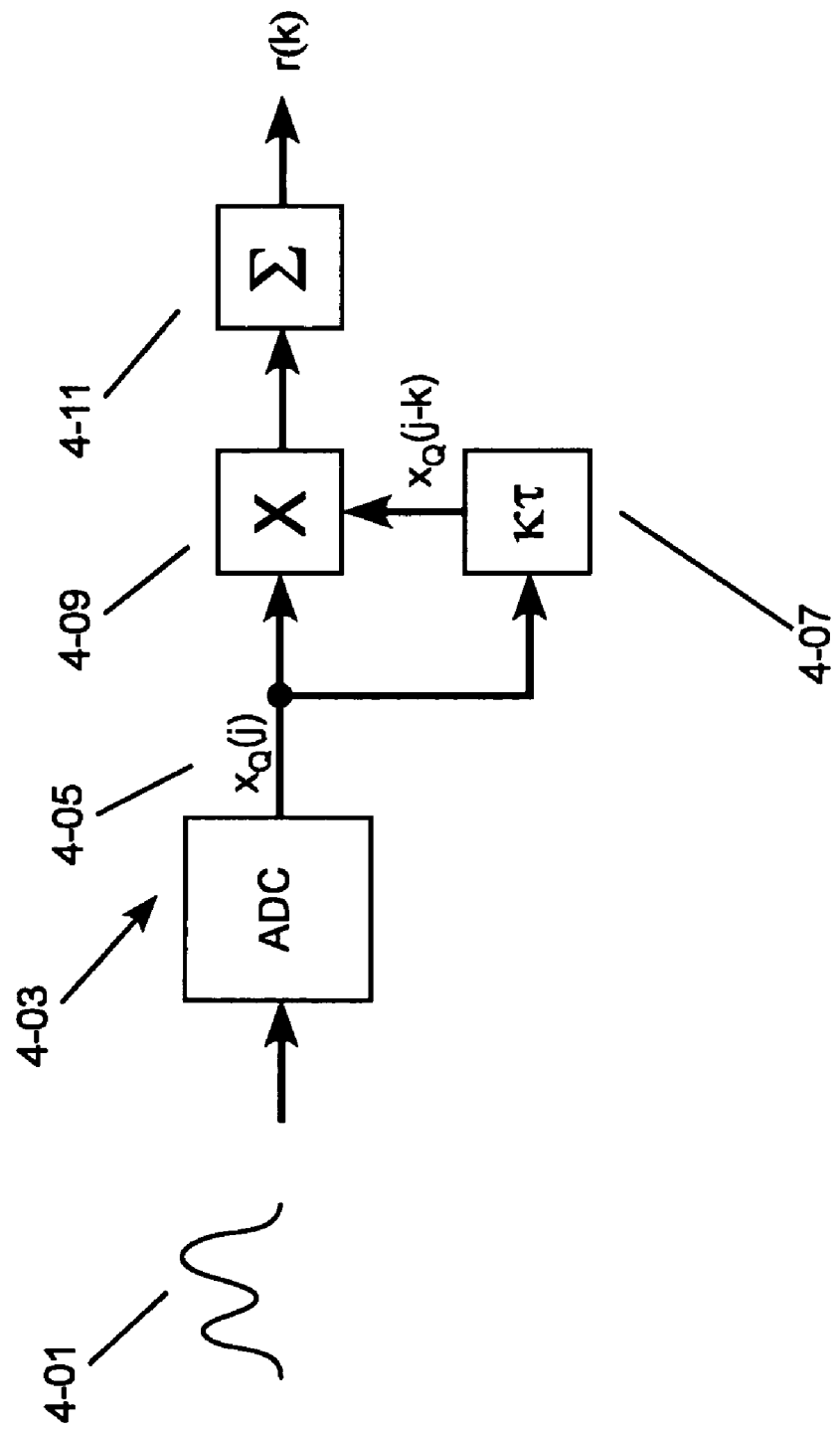
FIG. 4 illustrates a block-diagram of the sequential autocorrelator.

FIG. 4 shows a block diagram of a sequential autocorrelator. It sequentially computes coefficients r(k), k=0, ..., $N_k$. Analog signal 4-01 is sampled by an N-level ADC 4-03 at specified time moment j(n) and converted into digital code $x_Q(j)$ (4-05). Sample $x_Q(j)$ is recorded in the programmable delay element 4-07 for k Nyquist "clock" cycles. After idling for the same amount of time, another sample $x_Q(j+k)$ is taken and multiplied with the contents of register 4-07 in the multiplier 4-09. The product is accumulated in 4-11. The process repeats for n=1, 2, ..., $N_s$. The resulting content of accumulator 4-11 approximates the value r(k). Finally, the above process repeats for next k until all values of r are computed.

While the invention has been described in terms of one or more exemplary embodiments, those skilled in the art will recognize that the invention can be practiced with modification within the spirit and scope of the appended claims. Specifically, one of ordinary skill in the art will understand that the drawings herein are meant to be illustrative, and the design of the inventive assembly is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. An integrated spectrum analyzer for performing on-chip power spectrum measurements, said integrated spectrum analyzer comprising:
    a digital autocorrelator comprising:
        an analog input for inputting analog signal samples from a chip;
        an analog-to-digital converter for converting said analog signal samples into digital signal samples;
        a delay register for delaying a first converted digital signal sample;
        a digital multiplier for multiplying said first delayed digital signal sample with a second undelayed converted digital signal sample, to produce products of multiplication;
        an accumulator for accumulating a plurality of said products of multiplication over a period of time; and
        a digital integrator for integrating said accumulated products of multiplication,
    wherein said digital autocorrelator computes an autocorrelation function based on said analog signal samples, and
    wherein said digital autocorrelator is integrally formed on said chip for performing power spectrum measurements on said analog signal samples to compute said autocorrelation function.

2. The integrated spectrum analyzer for performing on-chip power spectrum measurements according to claim 1, wherein said autocorrelation function ρ(k) is computed based on the expression, $$\rho(k) = \frac{1}{N_s} \sum_{n=1}^{N_s} x(n) \cdot x(n+k), \quad k = 0, \ldots, N_k$$

wherein x represents said analog signal samples,
wherein x(n) represent said first delayed digital signal sample,
wherein k represents a value of Nyquist clock cycles,
wherein x(n+k) represents said undelayed converted digital signal sample, and
wherein the process repeats for n=1,2, . . . ,$N_s$.

3. An integrated spectrum analyzer for performing on-chip power spectrum measurements, said integrated spectrum analyzer comprising:
    a digital autocorrelator comprising:
        an analog input for inputting coarsely quantized analog signal samples from a chip;
        an analog-to-digital converter for converting said analog signal samples into digital signal samples;
        a storage register for storing a first converted digital signal sample for a period of time;
        a digital multiplier for multiplying said first stored digital signal after said period of time with a second undelayed digital signal sample to produce a product of multiplication; and
        an accumulator for accumulating a plurality of products of multiplication for each new period of time,
    wherein said digital autocorrelator computes an autocorrelation function based on said analog signal samples, and
    wherein said digital autocorrelator is integrally formed on said chip for performing power spectrum measurements on said analog signal samples to compute said autocorrelation function.

4. The integrated spectrum analyzer for performing on-chip power spectrum measurements according to claim 2, wherein said autocorrelation function r(k) is computed based on the expression, $$r(k) = \sum_{n=1}^{N_s} x_Q(j) x_Q(j+k), \quad j = (n-1)(k+1) + 1$$

wherein $x_Q$ represents said coarsely quantized analog signals samples,
wherein $x_Q(j)$ represents said first stored digital signal sample,
wherein k represents a value of Nyquist clock cycles,
wherein $x_Q(j+k)$ represents said second undelayed digital signal sample, and
wherein the process repeats for n=1,2, . . . ,$N_s$.

* * * * *